United States Patent [19]
Karube

[11] Patent Number: 5,751,167
[45] Date of Patent: May 12, 1998

[54] CMOS OUTPUT BUFFER CIRCUIT WHICH CONVERTS CMOS LOGIC SIGNALS TO ECL LOGIC SIGNALS AND WHICH DISCHARGES PARASITIC LOAD CAPACITANCES

[75] Inventor: Shunichi Karube, Tokyo, Japan

[73] Assignee: NEC Corporation, Tokyo, Japan

[21] Appl. No.: 667,870

[22] Filed: Jun. 20, 1996

Related U.S. Application Data

[63] Continuation-in-part of Ser. No. 542,336, Oct. 12, 1995, abandoned, which is a continuation of Ser. No. 290,499, Aug. 15, 1994, abandoned.

[30] Foreign Application Priority Data

Aug. 16, 1993 [JP] Japan .................. 5-202156

[51] Int. Cl.⁶ .................. H03K 19/0175; H03K 19/094
[52] U.S. Cl. .................. 326/73; 326/83
[58] Field of Search .................. 326/73, 68, 83, 326/86, 21; 322/170, 175

[56] References Cited

U.S. PATENT DOCUMENTS

| | | | |
|---|---|---|---|
| 4,779,013 | 10/1988 | Tanaka | 327/170 |
| 4,962,345 | 10/1990 | Crafts et al. | 327/170 |
| 5,047,671 | 9/1991 | Suthar et al. | 326/73 |
| 5,095,228 | 3/1992 | Galbraith et al. | 326/38 |
| 5,256,916 | 10/1993 | Thurston | 326/71 |
| 5,274,284 | 12/1993 | Krenik et al. | 326/121 |
| 5,319,252 | 6/1994 | Pierce et al. | 327/170 |
| 5,365,127 | 11/1994 | Manley | 326/73 |

OTHER PUBLICATIONS

A. Sedra et al., "Junction Field–Effect Transistors (JFETs) 6.1 Physical Operation", Microelectronic Circuits, Second Edition, pp. 262, 263, 330, and 332.
W. Buchsbaum, Buchsbaum's Complete Handbook of Practical Electronic Reference Data, Second Edition, p. 234.
A. Malvino, Electronic Principles, Second Edition, pp. 355 and 356.
M. Steyaert et al., "ECL–CMOS and CMOS–ECL Interface in 1.2–μm CMOS for 150–MHz Digital ECL Data Transmission Systems", IEEE Journal of Solid–State Circuits, vol. 26, No. 1, Jan. 1991, pp. 18–23.
Hans–Jurgen Schumacher et al., "CMOS Subnanosecond True–ECL Output Buffer", IEEE Journal of Solid–State Circuits, vol. 25, No. 1, Feb. 1990, pp. 150–154.
J. Chen, CMOS Devices and Technology for VLSI, p. 96.
B. Streetman, Solid State Electronic Devices, Second Edition, pp. 286 and 287.
N. Weste et al., Principles of CMOS VLSI Design — A Systems Perspective, Chapter 1 Introduction to CMOS Circuits, p. 6.

*Primary Examiner*—Edward P. Westin
*Assistant Examiner*—Richard Roseen
*Attorney, Agent, or Firm*—Young & Thompson

[57] ABSTRACT

Delay time characteristics of rise time and fall times of an output in a CMOS output buffer converting CMOS logic signals into ECL logic signals are made coincident with each other to eliminate various kinds of bias-voltage power supplies required for discharging the charge of capacitance parasitically present on an output-side. The amplifier 1 amplifies an input and supplies a driving input for an outputting P-channel MOSFET 2. A bypass control circuit 4, which inputs gate signals 1001 from the amplifier 1 and a drain potential of the outputting P-channel MOSFET 2 from an output terminal 105, acts as a NAND circuit of those two inputs, and feeds gate signals 1002 so as to cause conduction of the bypassing P-channel MOSFET only at a transient period during which a "high" level outputted to the output terminal 105 is converted into a "low" level, thus the charge on a load capacitance parasitically arisen on the output terminal 105 side is discharged.

2 Claims, 2 Drawing Sheets

CMOS OUTPUT BUFFER CIRCUIT WHICH CONVERTS CMOS LOGIC SIGNALS TO ECL LOGIC SIGNALS AND WHICH DISCHARGES PARASITIC LOAD CAPACITANCES

This application is a continuation-in-part of application Ser. No. 08/542,336 filed Oct. 12, 1995,abandoned, which is a continuation of application Ser. No. 08/290,499 filed Aug. 15, 1994, abandoned.

BACKGROUND OF THE INVENTION

1. Field of the Invention

This invention relates to a CMOS output buffer circuit, and in particular relates to a CMOS buffer circuit which receives an input at CMOS logic levels, and converts the CMOS logic levels into ECL (emitter coupled logic) levels.

2. Description of the Prior Art

A CMOS output buffer circuit as an output buffer, which converts a CMOS logic level within a Large-Scale Integration (hereinafter LSI) into an ECL logic level and supplies the converted signal to a load. The load is formed as a MOSFET. FIG. 1 is a first example of circuit diagram of such conventional CMOS output buffer circuit. In FIG. 1, input signals of the CMOS logic level (hereinafter referred to as "CMOS logic signal") are input into an amplifier unit 5 through an input terminal 501, where thus amplified signals are further fed, for example, to a gate of a P-channel MOSFET 6 as an output transistor. The P-channel MOSFET 6 with a source follower type feeds an output to a load (not shown) through an output terminal 502. The load includes a transmission line of output and a terminal resistance. A parasitic load capacitance develops due to distribution capacitance of the transmission line itself and the stray capacitance of related circuits.

FIG. 2 is a second example of a circuit diagram of the conventional CMOS output buffer circuit. The CMOS output buffer circuit in FIG. 2 comprises N-channel MOSFETs 7, 8, 9 and 11 and a P-channel MOSFET 10. In addition, FIG. 2 shows a VDD terminal 201 receiving a high potential power supply VDD, a VSS terminal 202 receiving a low potential power supply VSS containing a ground level, an input terminal 203 receiving CMOS logic signals, input terminals 204 and 205 of a P-channel MOSFET 10 and an N-channel MOSFET 9, respectively, and an output terminal 206.

The P-channel MOSFET 10 is an output transistor. The parasitic load capacitance is developed on the load connected to the output terminal 206 when the output is at a "high" level. The N-channel MOSFET 11 is a transistor for discharging a charging current of the load capacitance. The N-channel MOSFETs 7 and 9 are transistors for imposing a bias voltage on the P-channel MOSFET 10, the N-channel MOSFET 8 is a transistor for controlling a gate voltage of the N-channel MOSFET 11. Such a CMOS output buffer circuit is described in detail in "ECL-CMOS and CMOS-ECL Interface in 1.2 μm CMOS for 150-MHz Digital ECL Data Transmission Systems", IEEE Journal Solid-State Circuits, Vol. 26, No. 1, Jan., 1991.

The input terminals 204 and 205 are input terminals of bias potentials respectively, the P-channel MOSFET 10 and N-channel MOSFET 9 whose bias voltages are set through those input terminals 204 and 205 are to set a bias voltage of the output terminal 206 together with the N-channel MOSFET 7, a gate of which is clamped on the VDD terminal 201. On the other hand, the CMOS logic signals input into the input terminal 203, when they are at the same potential as the VDD terminal 201, make the N-channel MOSFET 8 conductive, and the N-channel MOSFET 11 non-conductive. At that time, a constant current due to the N-channel MOSFET 7 biased by a DC voltage charges a load capacitance through the output terminal 206. When the CMOS logic signals input into the input terminal 203 is at the same potential as the VSS terminal 202, the N-channel MOSFET 8 is in a non-conducting state, and a potential determined by the N-channel MOSFETs 7 and 9 of the bias transistors is to set a gate potential of the N-channel MOSFET 11, a situation of which is determined as a conducting state. Thus, a charge developed in the load capacitance is discharged through the output terminal 206 and the N-channel MOSFET 11.

In the conventional CMOS output buffer circuit, the current supplied to charge the load capacitance differs greatly from the capacitance discharging current. Therefore, the rise time and fall time of the output are largely different from each other, resulting in a disadvantageous variation in the duty cycle of an output waveform. In an output stage using a push-pull type by the P-channel and N-channel MOSFETs, a bias voltage must be imposed for controlling a gate potential of the output stage transistor conducting to the output terminal when discharging the load capacitance, resulting in the drawback of a considerably larger power consumption.

Furthermore, though an exact bias voltage is required for outputting a correct ECL level, it is difficult to produce a highly accurate constant voltage circuit of practical use in the CMOS circuit.

SUMMARY OF THE INVENTION

The present invention has been made for solving the problems described above. It is therefore an object of the invention to provide a CMOS output buffer circuit capable of considerably reducing power consumption and securing a correct ECL level substantially through a coincidence between rise time and fall time in an output signal without varying the output waveform duty cycle.

A CMOS output buffer circuit according to the present invention comprises; an amplifier for receiving and for amplifying CMOS logic signals, an outputting MOSFET for receiving an output of the amplifier and for feeding the output to a load; a bypassing MOSFET whose source is connected to a drain of the outputting MOSFET and whose drain is connected to a lower potential power supply of the amplifier, a gate of which is controlled in such a way that a charge due to the outputting MOSFET and of the parasitic load capacitance on the load-side of the outputting MOSFET is bypassed to the low potential power supply; and a bypass control circuit for receiving a first gate signal with the same polarity as the output of the amplifier and for outputting a second gate signal by controlling a gate of the bypassing MOSFET to discharge the capacitance.

A CMOS output buffer circuit according to the present invention is constructed in which the bypass control circuit is formed of a NAND circuit having two inputs and one output, the two inputs being the first gate signals received from the amplifier and an output of the outputting MOSFET, the NAND output being the second gate signal, the second gate signal being output at a transient time while an output fed from a source of the outputting MOSFET varies from "high" level to "low" level.

DETAILED DESCRIPTION OF THE PREFERRED EMBODIMENT

The present invention will now be described referring to FIG. 3.

Figure 1:
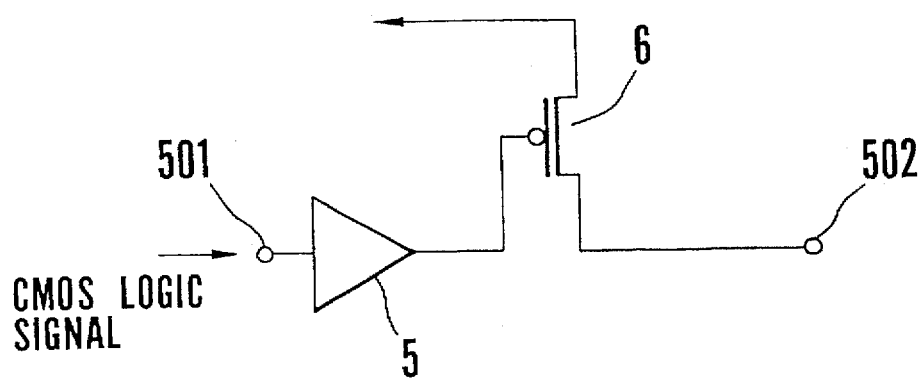
FIG. 1 is a circuit diagram of a first example of the conventional CMOS output buffer circuit.
Figure 2:
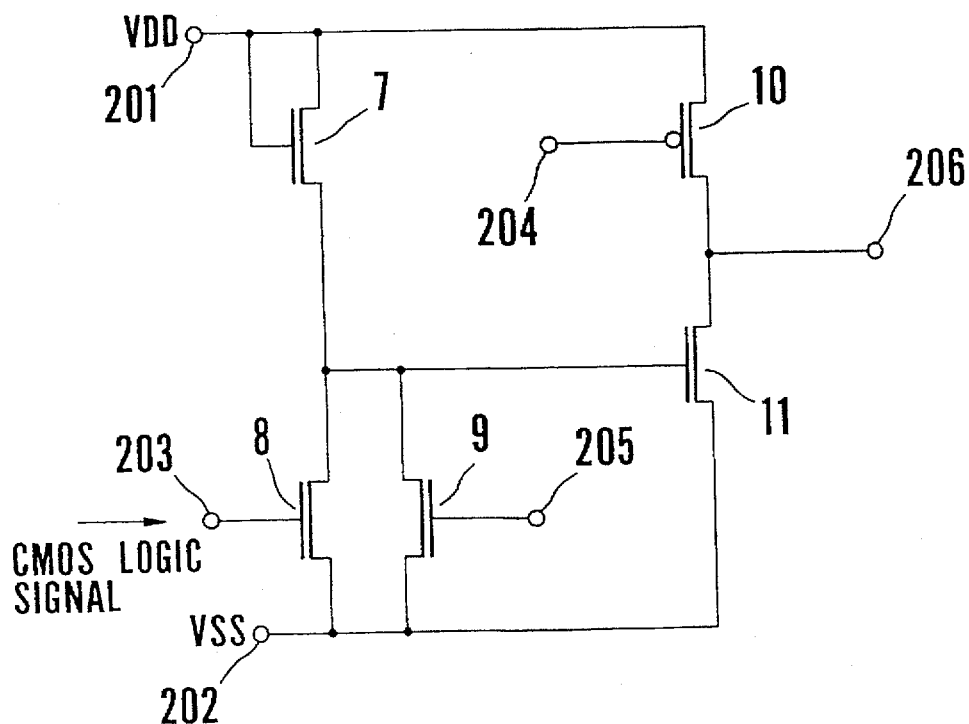
FIG. 2 is a circuit diagram of a second example of the conventional CMOS output buffer circuit.
Figure 3:
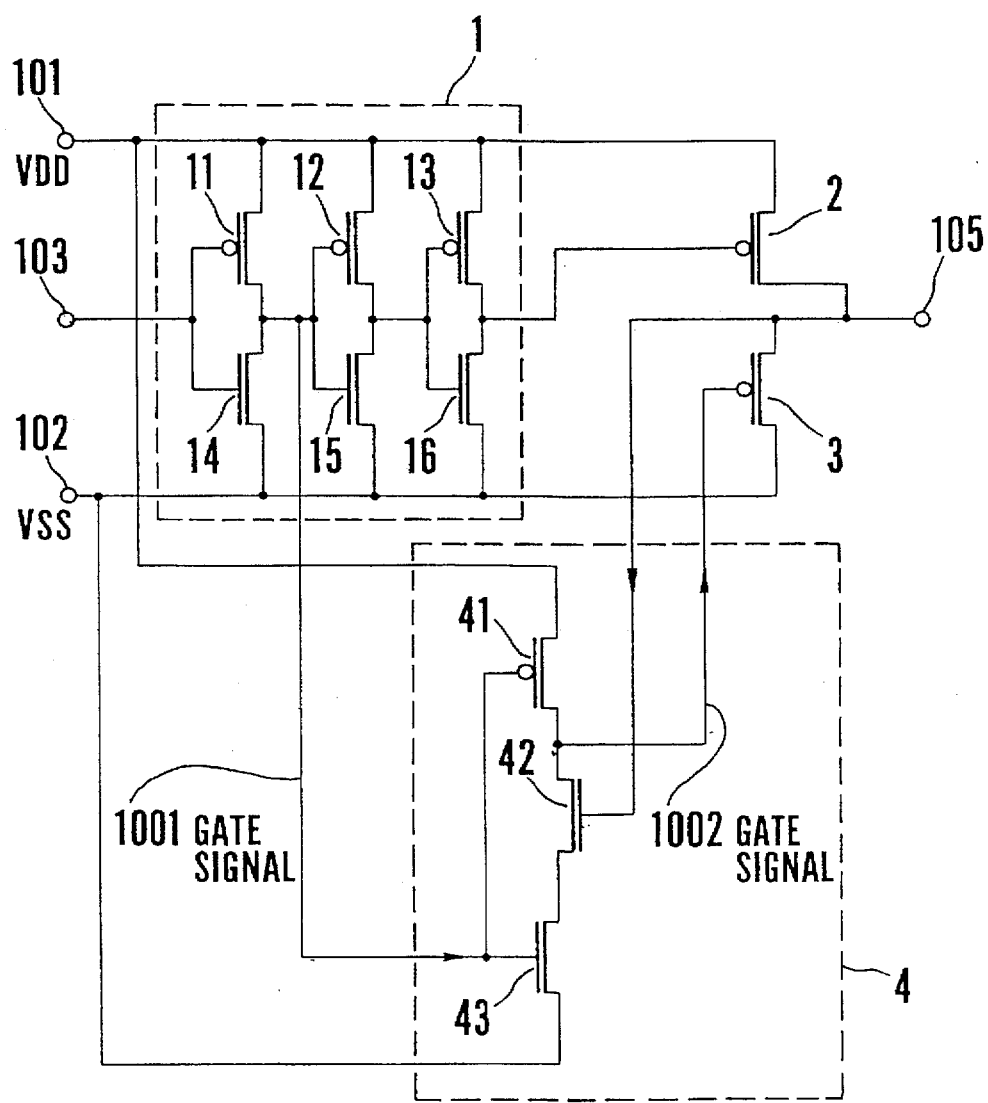
FIG. 3 is a circuit diagram of one embodiment of a CMOS output buffer circuit according to the invention.

FIG. 3 is a circuit diagram of one embodiment of a CMOS output buffer circuit according to the present invention. The CMOS output buffer circuit comprises an amplifier 1 containing three staged buffer amplifiers for receiving, amplifying and outputting CMOS logic signals, an outputting P-channel MOSFET 2 for feeding an output to a load, a bypassing P-channel MOSFET 3 for discharging parasitic load capacitance, and a bypass control circuit 4 for receiving gate signal 1001 as a first gate signal output from the amplifier 1 and for outputting gate signal 1002 as a second gate signal controlling conduction/non-conduction of the bypassing P-channel MOSFET 3. In addition, FIG. 3 shows a VDD terminal 101, a VSS terminal 102, an input terminal 103 and an output terminal 105. The VSS terminal 102 is given a ground potential, and the VDD terminal 101 is given a positive potential (for example 5V). The amplifier 1 includes a three stages cascade buffer amplifier formed of a P-channel MOSFET 11 and an N-channel MOSFET 14, a P-channel MOSFET 12 and an N-channel MOSFET 15, and a P-channel MOSFET 13 and an N-channel MOSFET 16. These buffer amplifiers have respective gates connected to each other to make them into an input point. Their drains are connected to make them into an output point. The buffers amplify an input to feed an amplified output with a reverse polarity relative to the input, thus operating as an inverter, and output a gate input enough to drive the outputting P-channel MOSFET 2.

A bypass control circuit 4 includes a P-channel MOSFET 41 and an N-channel MOSFET 43 in which gate signal 1001 having the same polarity as the amplifier 1 are input from the amplifier 1, and an N-channel MOSFET 42 for feeding gate signal 1002 to a gate of the bypassing P-channel MOSFET 3, where the bypass control circuit 4 forms a two-input NAND circuit.

The bypass control circuit 4 has a NAND structure as a circuit, and when gates of the P-channel MOSFET 41 and the N-channel MOSFET 43 and a gate of the N-channel MOSFET 42 are all "high", a level of the gate signal 1002 is "low", and the bypassing P-channel MOSFET 3 is in a conducting state. In the amplifier 1, there is an odd number of stages in the buffer amplifier, thus when an output of the first stage buffer amplifier is "high", or when the gate signal 1001 is "high", an amplified output of "high" (positive polarity) level is produced and imposed on a gate of the outputting P-channel MOSFET 2.

On the other hand, the parasitic load capacitance arising on the output terminal 105 is charged when "low" level is imposed on a gate of the outputting P-channel MOSFET 2, and to the contrary, the above comes to discharging state without charging when "high" level is imposed on the same. In this arrangement, the gate signal 1002 output from the bypass control circuit 4 remain "low" until a potential of the output terminal 105 becomes "low", thus the bypassing P-channel MOSFET 3 is placed in a conducting state. When a potential of the output terminal 105 is at a "low" level and when the outputting P-channel MOSFET 2 is in conducting state, the gate signal 1002 is "high", the bypassing P-channel MOSFET 3 is in non-conducting state, and this suppresses the conducting states at the same time of the outputting P-channel MOSFET 2 and the bypassing P-channel MOSFET 3.

In this way, the rise time and the fall time of the output are substantially coincident with each other, and it is therefore unnecessary to normally impose a bias voltage for an output terminal and for a transistor used for bypassing the charging current. Thus, power consumption can be considerably decreased.

In the embodiment described above, the three-staged structure is employed for the buffer amplifier of the amplifier 1. However, according to the present invention, it is understood that the buffer amplifier of the amplifier 1 may preferably be set suitably depending on channel selection of the outputting and bypassing transistors and depending on a two-input NAND construction of the bypass control circuit 4.

As hereinbefore fully described, the present invention is, in the CMOS output buffer circuit, to operate only during a transient time period in which an output varies from a "high" level to a "low" level, to discharge a parasitic load capacitance to largely shorten the fall time of the output, and to suitably select a constant of the bypass circuit to make the rise time and the fall time of the output substantially coincident with each other. In addition, a bias voltage imposed on the output-side and the bypass transistor become unnecessary and power consumption can considerably be advantageously reduced.

Modifications of the invention herein disclosed will occur to a person skilled in the art and all such modifications are deemed to be within the scope of this invention as defined by the appended claims.

I claim:

1. A CMOS output buffer circuit comprising:

an amplifier powered by a higher and a lower potential power supply, which amplifier is used for receiving and amplifying CMOS logic signals and for outputting a cascade amplifier output signal and a gate signal;

an outputting MOSFET for receiving, at its gate terminal, the cascade amplifier output signal;

a bypassing MOSFET having a source terminal connected to a drain terminal of the outputting MOSFET, a drain terminal connected to the lower potential power supply, and a gate terminal controlled in such a way that a charge caused by both the outputting MOSFET and a load capacitance parasitically arisen in a load of the outputting MOSFET, is bypassed to the lower potential power supply; and a bypass control circuit for receiving the first gate signals with the same polarity as the output of the amplifier, and for outputting a second gate signal to control the gate terminal of the bypassing MOSFET to discharge the charge.

2. A CMOS output buffer circuit as claimed in claim 1, wherein the bypass control circuit is constructed as a NAND circuit having two inputs and one output, the two inputs being the first gate signals received from the amplifier and an output of the outputting MOSFET, the one output being the second gate signal, wherein the second gate signal is output during a transient period during which the drain of the outputting MOSFET varies from a "high" level to a "low" level.

* * * * *